United States Patent
Miyazawa (10) Patent No.: US 9,676,670 B2
(45) Date of Patent: Jun. 13, 2017

(54) HANDLE SUBSTRATES OF COMPOSITE SUBSTRATES FOR SEMICONDUCTORS

(71) Applicant: NGK INSULATORS, LTD., Aichi-prefecture (JP)

(72) Inventor: Sugio Miyazawa, Kasugai (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/847,216

(22) Filed: Sep. 8, 2015

(65) Prior Publication Data

US 2015/0376066 A1    Dec. 31, 2015

Related U.S. Application Data

(63) Continuation of application No. PCT/JP2014/057633, filed on Mar. 13, 2014.

(30) Foreign Application Priority Data

Apr. 26, 2013   (JP) .................................. 2013-093622

(51) Int. Cl.
   *C04B 35/10*      (2006.01)
   *H01L 21/762*     (2006.01)
   *C04B 35/115*     (2006.01)

(52) U.S. Cl.
   CPC ............ *C04B 35/10* (2013.01); *C04B 35/115* (2013.01); *H01L 21/7624* (2013.01); *H01L 21/76251* (2013.01); *C04B 2235/3206* (2013.01); *C04B 2235/5409* (2013.01); *C04B 2235/5445* (2013.01); *C04B 2235/6025* (2013.01); *C04B 2235/6027* (2013.01);
   (Continued)

(58) Field of Classification Search
   CPC .............. C04B 35/10; H01L 21/76251; H01L 21/7624; Y10T 428/24355; Y10T 428/24372; Y10T 428/24413
   USPC .................................................. 428/141, 148
   See application file for complete search history.

(56) References Cited

U.S. PATENT DOCUMENTS 3,026,210 A *  3/1962  Coble ....................... H01J 5/04
                                                  264/1.21
6,090,648 A    7/2000  Reedy et al.
                       (Continued)

FOREIGN PATENT DOCUMENTS

JP    03-285865 A    12/1991
JP    05-009064 A     1/1993
                    (Continued)

OTHER PUBLICATIONS

International Search Report and Written Opinion for PCT Patent App. No. PCT/JP2014/057633 (Jun. 17, 2014), with English language translations of the Search Report and relevant parts of the Opinion.

(Continued)

*Primary Examiner* — Naathan Van Sell
(74) *Attorney, Agent, or Firm* — Cermak Nakajima & McGowan LLP; Tomoko Nakajima (57) ABSTRACT

A handle substrate is composed of a translucent alumina sintered body containing a sintering aid including at least magnesium. A concentration of magnesium at a bonding face of the handle substrate to a donor substrate is half or less of an average concentration of magnesium of the handle substrate.

8 Claims, 4 Drawing Sheets (52) U.S. Cl.
CPC *C04B 2235/6582* (2013.01); *C04B 2235/661* (2013.01); *C04B 2235/786* (2013.01); *Y10T 428/24413* (2015.01)

(56) References Cited

U.S. PATENT DOCUMENTS

| | | | |
|---|---|---|---|
| 6,306,788 B1* | 10/2001 | Watanabe | C04B 35/115 264/674 |
| 6,482,761 B1* | 11/2002 | Watanabe | C04B 35/115 501/127 |
| 6,908,828 B2 | 6/2005 | Letertre et al. | |
| 8,088,670 B2 | 1/2012 | Akiyama et al. | |
| 8,420,006 B2 | 4/2013 | Sakata et al. | |
| 8,975,159 B2 | 3/2015 | Akiyama | |
| 2008/0299742 A1* | 12/2008 | Akiyama | H01L 21/3065 438/458 |
| 2009/0211514 A1* | 8/2009 | Dillon | C30B 1/04 117/7 |
| 2009/0321747 A1* | 12/2009 | Murphy | H01L 21/76254 257/77 |
| 2011/0316003 A1* | 12/2011 | Murphy | H01L 21/76254 257/77 |
| 2012/0058622 A1* | 3/2012 | Kawai | H01L 21/76254 438/458 |
| 2012/0077023 A1* | 3/2012 | Nagahiro | C04B 35/119 428/328 |

FOREIGN PATENT DOCUMENTS

| | | | |
|---|---|---|---|
| JP | 05009064 A | * | 1/1993 |
| JP | 05-160240 A | | 6/1993 |
| JP | 08-512432 A | | 12/1996 |
| JP | 2000-219570 A | | 8/2000 |
| JP | 2003-089573 A | | 3/2003 |
| JP | 2003-224042 A | | 8/2003 |
| JP | 2008-288556 A | | 11/2008 |
| JP | 2009-102181 A | | 5/2009 |
| JP | 2009-184920 A | | 8/2009 |
| JP | 2009-209019 A | | 9/2009 |
| JP | 2010-278341 A | | 12/2010 |
| JP | 2011-100860 A | | 5/2011 |
| JP | 2012-109399 A | | 6/2012 |
| WO | WO2010/128666 A1 | | 11/2010 |

OTHER PUBLICATIONS

English language International Preliminary Report on Patentability for PCT Patent App. No. PCT/JP2014/057633 (received on Nov. 12, 2015).

Office Action for Japanese Patent App. No. 2015-513622 (Aug. 1, 2016).

Extended European Search Report for European Patent App. No. 15787593.4 (Oct. 31, 2016).

Office Action from Japanese Patent App. No. 2015-513622 issued on Feb. 3, 2017.

* cited by examiner

HANDLE SUBSTRATES OF COMPOSITE SUBSTRATES FOR SEMICONDUCTORS

TECHNICAL FIELD

The present invention relates to a handle substrate of a composite substrate for a semiconductor.

BACKGROUND ARTS

According to prior arts, it has been known to obtain SOI including a handle substrate composed of a transparent and insulating substrate and called Silicon on Quartz (SOQ), Silicon on Glass (SOG) and Silicon on Sapphire (SOS), and to obtain an adhered wafer by bonding a transparent wide-gap semiconductor including GaN, ZnO, diamond, MN or the like to a donor substrate such as silicon. SOQ, SOG, SOS and the like are expected for applications such as a projector and high frequency device due to the insulating property and transparency of the handle substrate. Further, the adhered wafer, which is a composite of a thin film of the wide-gap semiconductor and the handle substrate, is expected in applications such as a high performance laser and power device.

Such composite substrate for a semiconductor is composed of a handle substrate and donor substrate, and the handle and donor substrates are generally made of single crystal materials. According to prior arts, it was generally performed a method of forming a silicon layer on a base substrate by epitaxial growth. It has recently developed a method of directly bonding them to contribute to the improvement of performance of a semiconductor device (Patent documents 1, 2 and 3). That is, such handle and donor substrates are bonded through a bonding layer or an adhesive layer or directly bonded with each other.

However, sapphire is expensive. It is thus desired to use a substrate made of a material other than sapphire as the handle substrate for cost reduction. As the development of the bonding technique as described above, it has been proposed various kinds of handle substrates made of materials, other than sapphire, such as quartz, glass and alumina (Patent documents 4, 5, 6 and 7).

PRIOR TECHNICAL DOCUMENTS (Patent document 1) Japanese Patent Publication No. H08-512432A
(Patent document 2) Japanese Patent Publication No. 2003-224042A
(Patent document 3) Japanese Patent Publication No. 2010-278341A
(Patent document 4) WO 2010/128666 A1
(Patent document 5) Japanese Patent Publication No. H05-160240A
(Patent document 6) Japanese Patent Publication No. H05-160240A
(Patent document 7) Japanese Patent Publication No. 2008-288556A

SUMMARY OF THE INVENTION

In the case that quartz or a glass is used as a material of a handle substrate, as its thermal conductivity is low, heat dissipation from a semiconductor is insufficient. In the worst cases, problems such as burnout of the semiconductor would occur. A polycrystalline alumina sintered body has a thermal conductivity higher than those of quartz and a glass and thus suitable. However, it is necessary that a sintering aid is contained in a handle substrate made of polycrystalline alumina for the densification. The sintering aid is distributed in grain boundaries in alone or as a compound with alumina, which are low in mechanical strength and chemical strength compared with alumina grains. In the case that the bonding face to a semiconductor layer is subjected to precise polishing, it may become the cause that such regions are peeled off and alumina grains are removed (grain removal) and abrasive grains stick to the surface to leave recesses on the surface. If such grain removal or surface recesses are generated, the surface roughness is deteriorated and the bonding strength to the semiconductor layer is lowered when bonded to the semiconductor layer.

On the other hand, as an amount of the sintering aid contained in the alumina sintered body forming the handle substrate is made small, cracks or pores are generated due to abnormal grain growth during sintering. The surface roughness after subjecting the bonding face to the semiconductor layer to precise polishing treatment is thereby deteriorated, and the bonding strength is lowered in bonding to the semiconductor layer.

An object of the present invention is, in a handle substrate for a composite substrate for a semiconductor, to suppress the generation of grain removal and surface recesses, to reduce cracks and pores, and to prevent the deterioration of a bonding strength to a donor substrate.

The present invention provides a handle substrate of a composite substrate for a semiconductor. The handle substrate comprises a translucent alumina sintered body containing a sintering aid including at least magnesium. A concentration of magnesium at a bonding face of the handle substrate to a donor substrate is half or less of an average concentration of magnesium of the handle substrate.

The present invention further provides a composite substrate for a semiconductor, including the handle substrate and a donor substrate bonded to the bonding face of the handle substrate directly or through a bonding layer.

The inventors tried to produce a handle substrate made of a polycrystalline alumina sintered body. The polycrystalline material has the microstructure containing many fine grains bonded together. The inventors studied to produce such polycrystalline material and then to subject its surface to precise polishing process for making the Ra value sufficiently small. However, as an amount of a sintering aid is small, cracks and pores are generated in the vicinity of the bonding face. In the case that the amount is large, grain removal and surface recesses are generated, which are problematic.

The inventors studied a material, in which the bonding face of the handle substrate can be processed smoothly and an amount of the sintering aid at the side of the bonding face of the handle substrate can be made smaller.

As a result, magnesium oxide is added to the alumina sintered body as a sintering aid. And during the sintering, magnesium is discharged from the surface side and magnesium atoms are moved from the inside of the sintered body to facilitate the densification a s a whole. It is thereby possible to suppress the generation of cracks and pores in the vicinity of the bonding face. Further, as an amount of the sintering aid in the vicinity of the bonding face is suppressed at a lower value, the grain removal and surface recess are not generated during the precise polishing, so that the adhesion to the donor substrate can be completed without a problem.

EMBODIMENTS FOR CARRYING OUT THE INVENTION

The present invention will be further described below, referring to the drawings appropriately.

(Composite Substrate for Semiconductor)

The composite substrate of the present invention can be utilized for a light-emitting device for a projector, high frequency device, high performance laser, power device, logic IC or the like.

The composite substrate includes the inventive handle substrate and a donor substrate.

Materials of the donor substrates are not particularly limited, and may preferably be selected from the group consisting of silicon, aluminum nitride, gallium nitride, zinc oxide and diamond. The thickness of the donor substrate is not particularly limited, and may be near that of conventional SEMI/JEIDA standard on the viewpoint of handling.

The donor substrate may include the above described material whose surface may include an oxide film. It is because the effect of preventing channeling of implanted ions is obtained by performing ion implantation through the oxide film. The oxide film preferably has a thickness of 50 to 500 nm. Such donor substrate including the oxide film is also categorized as the donor substrate, and it is called donor substrate unless specifically indicated.

(Handle Substrate)

The thickness of the handle substrate is not particularly limited, and may be near that of conventional SEMI/JEIDA standard on the viewpoint of handling.

As a polycrystalline material, alumina sintered body is used, and translucent alumina sintered body is most preferably used. As the reason, an extremely dense sintered body can be obtained, so that fracture and cracks of the handle substrate are hardly generated.

Methods of molding the translucent alumina substrate is not particularly limited, and may be an optional process such as doctor blade, extrusion, gel cast molding or the like. Most preferably, the substrate is produced utilizing gel cast molding. According to a preferred embodiment, slurry containing ceramic powder, dispersing agent and gelling agent is cast into a mold, the slurry is then gelled to obtain a molded body, and the molded body is sintered.

Preferably, 100 ppm more and 300 ppm or less of magnesium oxide is added to high-purity alumina powder having a purity of 99.9 percent or higher (preferably 99.95 percent or higher). Such high-purity alumina powder includes high-purity alumina powder produced by Taimei Chemical Industries Corporation. Further, a purity and an average grain size of the magnesium oxide powder may preferably be 99.9 percent or higher and 0.3 µm or smaller, respectively.

An average grain size of the alumina sintered body may preferably be made 5 to 60 µm. The flatness of the bonding face can be easily assured. On the viewpoint, the average grains size of the alumina sintered body may more preferably be made 10 to 50 µm.

Figure 1A:
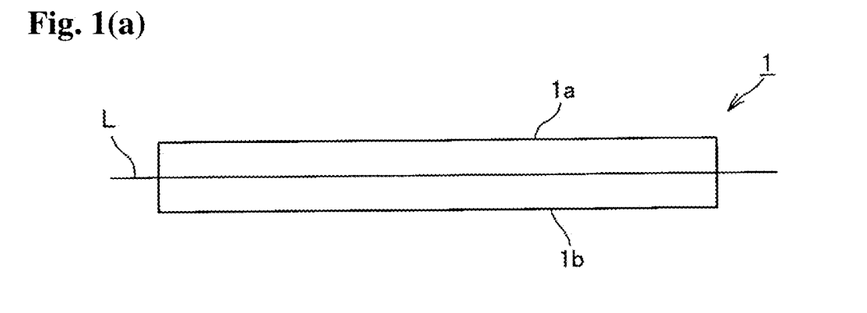
FIG. 1(a) is a view schematically showing a handle substrate 1 according to the present invention.

An average grains size a of alumina crystal grains at the bonding face of the handle substrate is preferably larger than the average grain size b of alumina grains at a center line L (FIG. 1(*a*)) in the direction of thickness of the handle substrate. It is thus possible to reduce an amount of grain boundaries so that the flatness of the bonding face can be easily assured, while cracks, pores or the like on the bonding face can be suppressed. The ratio (a/b) may preferably be 1.1 or larger and more preferably be 1.2 or larger.

Here, the average grain size of the crystal grains is measured as follows.

(1) The section of the handle substrate is subjected to mirror surface polishing and then thermal etching, emphasizing grain boundaries. Then, a microscopic photograph of the section (at 100 to 200-fold magnification) is taken, and the number of grains, through which a straight line with a unit length passes, is counted. This measurement is performed at three different positions. Note that the unit length is set to a range of 500 µm to 1000 µm.

(2) The numbers of grains performed at the three positions are averaged.

(3) The average grain size is calculated by the following formula.

$$D=(4/\pi)\times(L/n) \qquad \text{[Calculation Formula]}$$

[D: Average grain size, L: Unit length of straight line, n: Average of the numbers of grains at the three positions]

Figure 2:
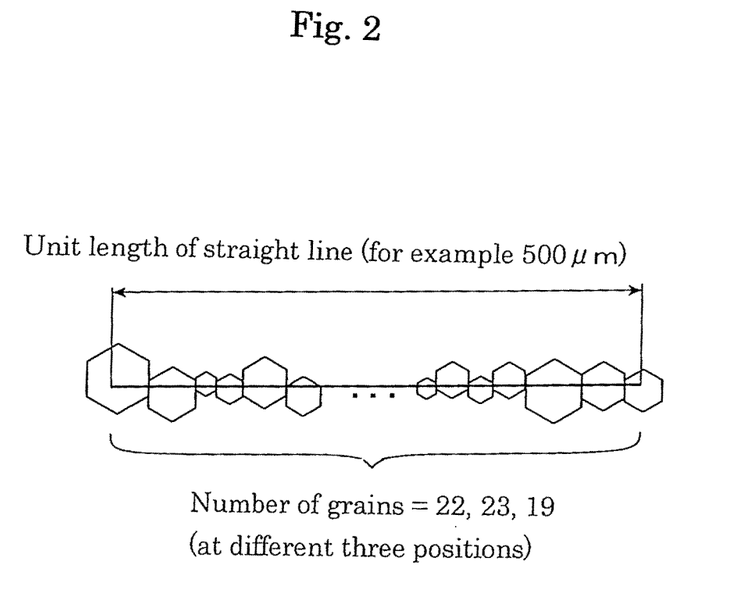
FIG. 2 is a diagram schematically showing an example of calculating an average grain size.
Figure 3:
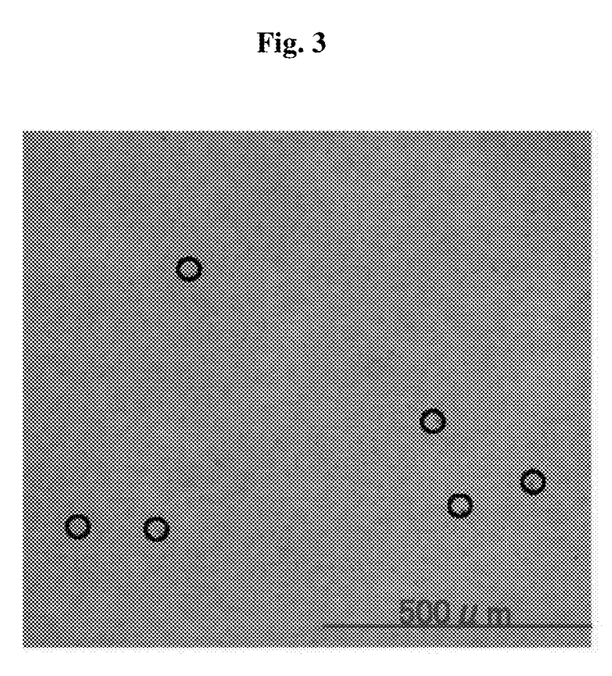
FIG. 3 is an image showing state of removal of grains and surface recesses in an example and taken by a differential interference contrast microscope.
Figure 4:
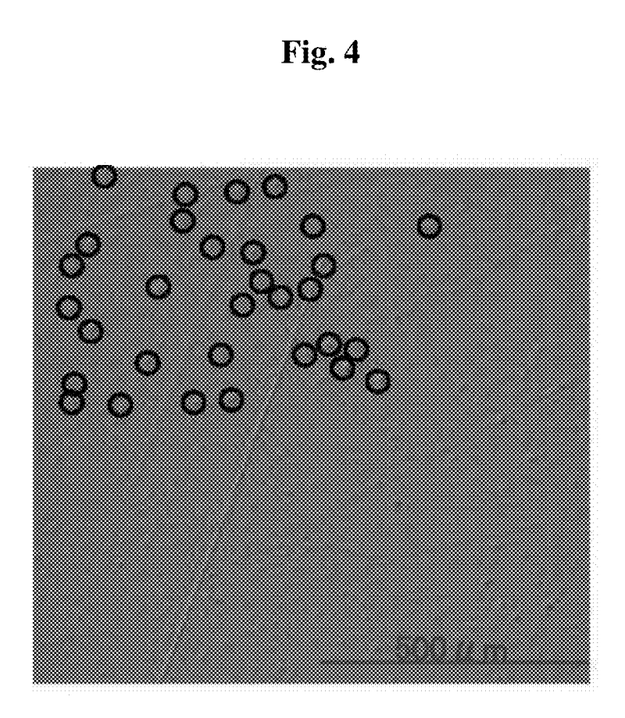
FIG. 4 is an image showing state of removal of grains and surface recesses in a comparative example and taken by a differential interference contrast microscope.

An example of calculation of the average grain size is shown in FIG. 2.

When the numbers of grains, through which the straight line with the unit length (e.g., 500 µm) passes, at the respective three different positions are 22, 23, and 19, the average grain size D is determined based on the above-mentioned calculation formula as follows.

$$D=(4/\pi)\times[500/\{(22+23+19)/3\}]=29.9 \text{ µm}.$$

Further, the relative density of the alumina sintered body may preferably be 98 percent or larger and more preferably be 99 percent or larger, on the viewpoint of endurance against the subsequent process of a semiconductor and prevention of contamination of it.

According to the present invention, a concentration of magnesium at the bonding face of the handle substrate to the donor substrate is made half or less of an average concentration of magnesium of the handle substrate. It is thus possible to reduce an amount of magnesium at the surface of the handle substrate and to suppress pores and cracks in the handle substrate to improve the adhesion to the donor substrate. On the viewpoint, the concentration of magnesium at the bonding face of the handle substrate to the donor substrate may preferably be 1.3 or lower, and more preferably ¼ or lower, of the average concentration of magnesium of the handle substrate.

According to a preferred embodiment, the concentration of magnesium at the bonding face of the handle substrate is $10\times10^{10}$ atom/cm$^2$ or lower and more preferably $9\times10^{10}$ atom/cm$^2$ or lower.

Further, on the viewpoint of improving the adhesion of the handle substrate to the donor substrate, the average concentration of magnesium of the handle substrate may preferably be $20\times10^{10}$ atom/cm$^2$ or higher and more preferably be $30\times10^{10}$ atom/cm$^2$ or higher.

By making an addition amount of magnesium oxide into raw material for producing the handle substrate 100 ppm or higher, it is possible to facilitate the densification of the handle substrate and to suppress the reduction of the bonding strength to the donor substrate due to cracks, pores or the like in the vicinity of the bonding face. On the viewpoint, the addition amount of magnesium oxide may preferably be 150 ppm or higher. Further, By making the addition amount of magnesium oxide 300 ppm or lower, it is easier to suppress diffusion of magnesium from the handle substrate into the donor substrate.

The concentration of magnesium at the bonding face can be measured by Total Reflection X-ray Fluorescence (TXRF) under the following measurement conditions.

X ray source: W sealed type X ray vacuum tube (voltage 40 kV, current 40 mA)

Angle of incidence: 0.05°

Integration time: 500 seconds

The measurement of the average concentration of magnesium of the handle substrate can be performed, by dissolving a sample ground into powder with sulfuric acid through pressurized acid decomposition to obtain dissolved solution and by analyzing the dissolved solution by means of ICP emission spectroscopic analysis.

According to a preferred embodiment, an amount of an impurity, other than alumina and magnesium oxide, contained in the translucent alumina substrate is 0.2 mass percent or smaller, so that it is possible to prevent the contamination of a semiconductor. The present invention is thus particularly useful.

The average particle size (primary particle size) of the raw material is not particularly limited, and may preferably be 0.6 m or smaller and more preferably be 0.4 $\mu$m or smaller, on the viewpoint of densification by the sintering at a low temperature. More preferably, the average particle size of the powdery raw material is 0.3 $\mu$m or smaller. The lower limit of the average particle diameter is not particularly limited. The average particle diameter of the powdery raw material can be decided by direct observation of the powdery raw material using SEM (Scanning type electron microscope).

Besides, the average particle size means an average value of n=500 values of (length of the longest axis+ length of the shortest axis)/2 of primary particles, excluding secondary aggregated particles, in optional two visual fields at a magnitude of ×30000 of SEM photograph.

The gel cast molding includes the following methods.

(1) Inorganic powder, prepolymer as a gelling agent such as polyvinyl alcohol, epoxy resin, phenol resin or the like and a dispersing agent are dispersed in dispersing medium to produce slurry. The slurry is cast into a mold and then cross-linked three-dimensionally using a cross-linking agent to complete the gelation, so that the slurry is solidified.

(2) An organic dispersing medium having a reactive functional group and gelling agent are chemically bonded to each other to solidify the slurry.

For obtaining the handle substrate of the present invention, the sintering temperature may preferably be 1700 to 1900° C. and more preferably be 1750 to 1850° C., on the viewpoint of densification of the sintered body.

After generating the fully-dense sintered body in the sintering process, further an annealing treatment may be additionally performed at the sintering temperature. From the viewpoint of promoting the discharge of magnesia while preventing deformation and occurrence of abnormal grain growth, the annealing temperature is preferably within a range of the maximum temperature in the sintering ±100° C., in which the maximum temperature is more preferably 1900° C. or lower. The annealing time period is preferably in a range of 1 to 6 hours.

Further, the annealing temperature may preferably be in a range of the maximum temperature +0 to 100° C.

Further, during the sintering as described above, the substrate is mounted on a flat plate made of a metal having a high melting point such as molybdenum. At this time, it is preferred to form a space of 0.5 to 1.0 mm over the substrate for facilitating the discharge of magnesium. On the other hand, during the annealing, it is preferred to mount a plate of molybdenum or the like on the substrate so that the substrate is interposed between the plates, on the viewpoint of facilitating the densification, of making the concentration of magnesium and grain sizes uniform and of preventing the deformation of the substrate.

The molding and sintering steps are performed as described above to obtain a blank substrate made of alumina sintered body.

The alumina sintered body has microstructure in which many fine alumina grains are bonded together. The surface of the blank substrate is subjected to high-precision polishing. The crystal grains are thereby polished along a plane, and the polished crystal grains, each having a flat surface, are exposed to the surface. The respective exposed surfaces of the polished crystal grains become smooth.

The blank substrate is subjected to high-precision polishing, resulting in a reduced central average surface roughness Ra in microscopic view of each crystal grain. Such high-precision polishing generally includes chemical mechanical polishing (CMP). A polishing slurry suitable for use in this process is one obtained by dispersing abrasive grains having a grain size of 30 nm to 200 nm into alkali or neutral solution. Examples of materials for the abrasive grains can include silica, alumina, diamond, zirconia, and ceria. They are used either alone or in combination. Examples of the polishing pads can include a rigid urethane pad, a nonwoven pad, and a suede pad.

An annealing treatment is desirably performed after executing a rough polishing process, before the final precise polishing process. Atmospheric gases suitable for the annealing treatment can include, for example, air, hydrogen, nitrogen, argon, and vacuum. The annealing temperature is preferably in a range of 1200 to 1600° C., and the annealing time period is preferably in a range of 2 to 12 hours. It is thereby possible to facilitate the discharge of magnesia without degrading the smoothness of the surface.

According to a preferred embodiment, the center line average surface roughness Ra of the surface of the handle substrate in microscopic view is 5 nm or smaller. If it is large, the bonding strength to the donor substrate is reduced due to intermolecular force. The roughness may preferably be 3 nm or smaller and most preferably be 1 nm or smaller. Besides, this is a numerical value calculated based on JIS B0601 from an image of each exposed surface of each crystal grain exposed to the surface taken by an atomic force electron microscope.

In the case that the surface roughness of each surface of each crystal grain is microscopically observed, it is applied observation of surface morphology by AFM (Atomic force Microscope) in a visual field of 10 $\mu$m.

According to the thus obtained handle substrate 1, the concentration of magnesium at the bonding face 1a is preferably $10 \times 10^{10}$ atom/cm$^2$ or lower and more preferably $9 \times 10^{10}$ atom/cm$^2$ or lower.

Figure 1B:
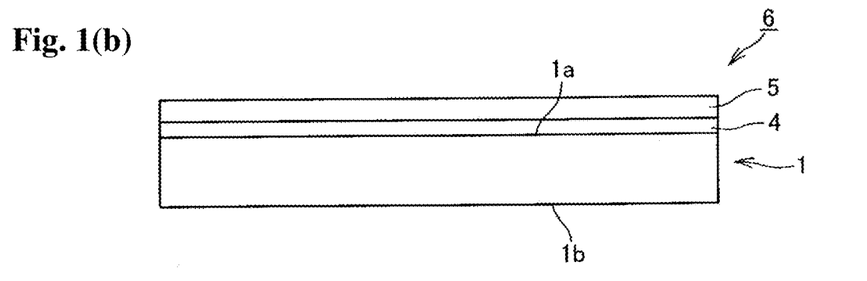
FIG. 1(b) is a view schematically showing a composite substrate 6 obtained by bonding a donor substrate 5 onto the handle substrate 1 through a bonding layer 4, and FIG. 1(*c*) is a view schematically showing a composite substrate 6A obtained by bonding a donor substrate 5 directly onto the handle substrate 1.
Figure 1C:
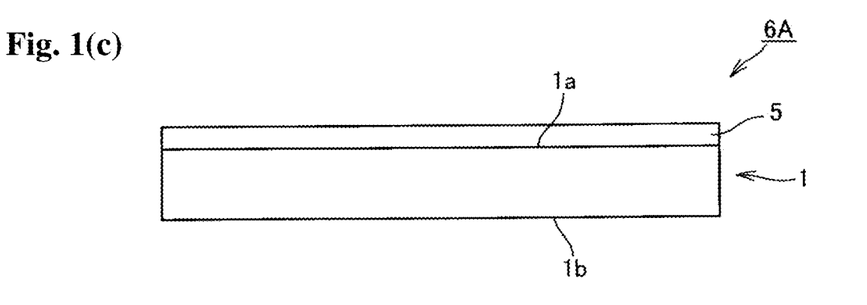

After the handle substrate is obtained, the donor substrate 5 may be bonded to the bonding face 1a of the handle substrate 1. According to the example of FIG. 1(b), the donor substrate 5 is bonded to the bonding face 1a of the handle substrate 1 through a bonding layer 4. According to example of FIG. 1(c), the donor substrate 5 is directly bonded to the bonding face 1a of the handle substrate 1. In these cases, as the bonding face 1a of the handle substrate 1 is smooth in microscopic view, the bonding strength to the donor substrate can be improved.

(Embodiment of Bonding)

Further, as a technique used for the bonding, it may be used direct bonding through surface activation and substrate bonding technique using an adhesive layer, for example, although it is not particularly limited.

As the direct bonding, it may be appropriately used low-temperature bonding technique through surface activation. After the surface activation is performed in vacuum of about $10^{-6}$ Pa using Ar gas, a single crystalline material, such as Si, can be bonded to a polycrystalline material through an adhesive layer such as $SiO_2$ at ambient temperature.

As an example of the adhesive layer, $SiO_2$, $Al_2O_3$ and SiN are used in addition to the adhesion with a resin.

EXAMPLES

It was produced a handle substrate 1 using translucent alumina sintered body, for conforming the effects of the present invention.

First, it was produced blank substrate made of translucent alumina sintered body.

Specifically, it was produced slurry by mixing the following ingredients.

| (Powdery raw material) | |
|---|---|
| α -alumina powder having a specific surface area of 3.5 to 4.5 m²/g and an average primary particle size of 0.35 to 0.45 μm | 100 weight parts |
| MgO (magnesia) | 0.025 weight parts |
| (Dispersing medium) | |
| Dimethyl glutarate | 27 weight parts |
| Ethylene glycol | 0.3 weight parts |
| (Gelling agent) | |
| MDI resin | 4 weight parts |
| (Dispersing agent) | |
| High molecular surfactant | 3 weight parts |
| (Catalyst) | |
| N,N-dimethylaminohexanol | 0.1 weight part |

The slurry was cast into a mold made of an aluminum alloy at room temperature and then maintained at room temperature for 1 hour. It was then maintained at 40° C. for 30 minutes for the solidification and then released from the mold. It was further maintained at room temperature and 90° C. for 2 hours, respectively, to obtain a plate-like powder molded body.

The thus obtained powder molded body was calcined (preliminary sintering) in air at 1100° C., then sintered in atmosphere of hydrogen 3: nitrogen 1 at 1750° C. to progress the densification. It was then annealed in atmosphere of hydrogen 3: nitrogen 1 at 1750° C. for 3 hours to obtain a blank substrate.

The thus produced blank substrate was subjected to high-precision polishing. First, both faces were subjected to lapping using green carbon to adjust the shape, and the surface was then subjected to single-face lapping using diamond slurry. It was then performed annealing process in air at 1300° C. for 6 hours, and it was then performed CMP polishing using colloidal silica, for obtaining the target surface roughness. At this time, the overall processing amounts were adjusted so that the amount was made 200 μm in depth and processing amount becomes 10 μm after the annealing. Further, the substrate after the processing was alternately immersed in ammonia peroxide, chloric acid peroxide, sulfuric acid, fluoric acid, aqua regina and pure water to perform the cleaning to produce the handle substrate 1.

As to the thus obtained handle substrate, a central line average surface roughness Ra of the bonding face 1a in microscopic view (field of 10 μm×10 μm) was measured and proved to be less than 1 nm. Further, the count of occurrence of grain removal and surface recess in macroscopic view (field of 1 mm×1 mm) was less than 10 counts. Besides, as to the measurement, the microscopic surface roughness was imaged by an atomic force electron microscope and calculated according to JIS B0601. The grain removal and surface recess in the case of macroscopic view were observed using a differential interference microscope at a magnification of 100.

The average grain size of the handle substrate was measured and proved to be 30 μm in the vicinity of the surface and 25 μm in the vicinity of the central line in the direction of thickness.

Further, concentration of Mg at the surface of the thus produced handle substrate was measured by ICP-MS and proved to be $9 \times 10^{10}$ atom/cm². Further, the whole substrate was ground and the concentration of Mg was measured by ICP-MS and proved to be about $40 \times 10^{10}$ atom/cm².

An $SiO_2$ layer was formed on the surface of the thus obtained handle substrate as the adhesive layer to a silicon thin plate. Plasma CVD was applied for forming the film, and CMP polishing (Chemical mechanical polishing) was performed after the film formation so that the film thickness of the finally obtained $SiO_2$ layer was made 100 nm. Thereafter, plasma activation method was performed so that the Si substrate and $SiO_2$ layer were directly bonded with each other to produce a composite substrate composed of Si—$SiO_2$-translucent alumina. As a result, good bonding state was realized and cracks, peeling and fracture were not observed. Further, the thus obtained composite substrate was heat treated at 1000° C. for 30 minutes, and it was thereby proved that the state of the bonding was not changed, and cracks and peeling were not observed.

Examples 2 to 8

Composite substrates were produced according to the same procedure as the Example 1. However, the sintering temperature, annealing temperature after the sintering, annealing time period, annealing temperature after the lapping and annealing time period after the lapping were changed, as shown in table 1.

As to the handle substrates of the respective examples, the concentration of magnesium at the surface, magnesium concentration as a whole, average grain size in the vicinity of the surface, average grain size in the vicinity of the central line, and surface roughness, grain removal and surface recess on the bonding face were measured, according to the same procedure as the example 1. The results of measurement were shown in table 1.

It was further tried to bond the handle substrate of each example to the silicon thin plate according to the same procedure as the example 1. As a result, good bonding state was realized and cracks, peeling and fracture were not observed. Further, the thus obtained composite substrate was heat treated at 1000° C. for 30 minutes, and it was thereby proved that the state of the bonding was not changed, and cracks and peeling were not observed.

Comparative Example

A handle substrate was produced according to the same procedure as the example 1. However, the sintering temperature was made 1650° C., and the annealing process after the sintering and the annealing after the single-side lapping were not performed.

The concentration of Mg at the surface of the thus produced substrate was measured according to the same procedure as the example 1 and proved to be $30 \times 10^{10}$ atom/cm$^2$. Further, the whole substrate was ground, and the concentration of Mg was measured and proved to be $40 \times 10^{10}$ atom/cm$^2$. As the average grains size of the handle substrate was measured, it was 9 µm in the vicinity of the surface and the center line in the direction of thickness.

As to the thus obtained handle substrate, the central line average surface roughness Ra of the bonding face 1a in microscopic view was measured and proved to be less than 1 nm. However, more than 100 counts of grains removal parts and surface recesses in macroscopic view were observed.

Further, the thus obtained composite substrate was subjected to thermal treatment at 1000° C. for 30 minutes. As a result, the peeling of the bonding part was observed.

TABLE 1

| Inventive examples | 1 | 2 | 3 | 4 | 5 |
|---|---|---|---|---|---|
| Sintering temperature(° C.) | 1750 | 1750 | 1750 | 1850 | 1850 |
| Annealing temperature after sintering (° C.) | 1750 | 1800 | 1750 | 1750 | 1850 |
| Annealing time after sintering | 3 hr | 1 hr | 3 hr | 3 hr | 3 hr |
| Annealing temperature after lapping (° C.) | 1300 | 1300 | 1300 | 1300 | 1300 |
| Annealing time after lapping | 6 hr | 6 hr | 3 hr | 6 hr | 6 hr |
| Mg concentration at surface ($\times 10^{10}$ atom/cm$^2$) | 9 | 9 | 10 | 8 | 9 |
| Mg concentration of whole substrate ($\times 10^{10}$ atom/cm$^2$) | 40 | 40 | 40 | 40 | 40 |
| Grain size near surface | 30 µm | 28 µm | 30 µm | 35 µm | 40 µm |
| Grains size near central line | 25 µm | 25 µm | 25 µm | 28 µm | 30 µm |
| Surface roughness of bonding face | <1 nm | <1 nm | <1 nm | <1 nm | <1 nm |
| Number of grain removal and surface recess (counts/mm2) | <10 | <10 | <10 | <10 | <10 |

TABLE 2

|  | Example 6 | Example 7 | Example 8 | Comparative Example |
|---|---|---|---|---|
| Sintering temperature(° C.) | 1700 | 1750 | 1750 | 1650 |
| Annealing temperature after sintering (° C.) | 1700 | 1750 | 1750 | None |
| Annealing time after sintering | 6 hr | 3 hr | 3 hr | None |
| Annealing temperature after lapping (° C.) | 1300 | 1200 | 1400 | None |
| Annealing time after lapping | 6 hr | 6 hr | 3 hr | None |
| Mg concentration at surface ($\times 10^{10}$ atom/cm$^2$) | 10 | 9 | 9 | 30 |
| Mg concentration of whole substrate ($\times 10^{10}$ atom/cm$^2$) | 40 | 40 | 40 | 40 |
| Grain size near surface | 20 µm | 30 µm | 30 µm | 9 µm |
| Grains size near central line | 16 µm | 25 µm | 25 µm | 9 µm |
| Surface roughness of bonding face | <1 nm | <1 nm | <1 nm | <1 nm |
| Number of grain removal and surface recess (counts/mm2) | <10 | <10 | <10 | >100 |

The invention claimed is:

1. A handle substrate of a composite substrate for a semiconductor: said handle substrate consisting essentially of a translucent polycrystalline alumina sintered body comprising a sintering aid comprising at least magnesium;
    wherein a concentration of magnesium at a bonding face of said handle substrate to a donor substrate is half or less of an average concentration of magnesium of said handle substrate;
    wherein a center line average surface roughness Ra in microscopic vies of said bonding face of said handle substrate is 5 nm or smaller;
    wherein said alumina sintered body comprises alumina crystal grains having an average grain size of 5 to 60 µm;
    wherein said alumina sintered body has a relative density of 98 percent or higher;
    wherein magnesium is present in said alumina sintered body in a concentration of less than 300 ppm in terms of magnesium oxide; and
    wherein an amount of an impurity excluding alumina and magnesium oxide in said sintered body is 0.2 mass percent or smaller.

2. The handle substrate of claim 1, wherein said concentration of magnesium at said bonding face of said handle substrate is $10 \times 10^{10}$ atom/cm$^2$ or lower.

3. The handle substrate of claim 1, wherein said average concentration of magnesium of said handle substrate is $20 \times 10^{10}$ atom/cm$^2$ or higher.

4. The handle substrate of claim 1, wherein an average grain size of alumina crystal grains at said bonding face of said handle substrate is larger than an average grains size of alumina crystal grains at a center line in the direction of thickness of said handle substrate.

5. A composite substrate for a semiconductor, said composite substrate comprising said handle substrate of claim 1 and a donor substrate bonded to said bonding face of said handle substrate directly or through a bonding layer.

6. The composite substrate of claim 5, wherein said donor substrate comprises silicon single crystal.

7. The handle substrate of claim 3, wherein the average concentration of magnesium in the handle substrate is $20 \times 10^{10}$ atom/cm$^2$ to $40 \times 10^{10}$ atom/cm$^2$.

8. The handle substrate of claim 2, wherein the concentration of magnesium at the bonding face of the handle substrate is greater than 0.

* * * * *